United States Patent [19]

Meijer

[11] Patent Number: 5,790,757
[45] Date of Patent: Aug. 4, 1998

[54] SIGNAL GENERATOR FOR MODELLING DYNAMICAL SYSTEM BEHAVIOR

[75] Inventor: Peter B. L. Meijer, Eindhoven, Netherlands

[73] Assignee: U.S. Philips Corporation, New York, N.Y.

[21] Appl. No.: 869,019

[22] Filed: Jun. 4, 1997

Related U.S. Application Data

[63] Continuation of Ser. No. 499,354, Jul. 7, 1995, abandoned.

[30] Foreign Application Priority Data

Jul. 8, 1994 [EP] European Pat. Off. .............. 94201976

[51] Int. Cl.$^6$ ................................................ G06F 15/18
[52] U.S. Cl. .................... 395/10; 706/10; 706/15
[58] Field of Search ........................ 395/3, 10, 27, 395/61, 900, 20

[56] References Cited

U.S. PATENT DOCUMENTS

| | | |
|---|---|---|
| 4,994,982 | 2/1991 | Duranton et al. . |
| 5,025,499 | 6/1991 | Inoue et al. ........................ 395/10 |
| 5,107,454 | 4/1992 | Niki ................................ 395/24 |
| 5,200,898 | 4/1993 | Yuhara et al. . |
| 5,245,695 | 9/1993 | Baseshore ........................ 395/3 |
| 5,293,459 | 3/1994 | Duranton et al. . |

OTHER PUBLICATIONS

K-.I Funahashi et al., "Approximation Of Dynamical Systems By Continuous Time Recurrent Neural Networks", Neural Networks vol. 6, pp. 801–809, 1993.

Levin, A. U., and Narendra, K. S., "Control of Nonlinear Dynamical Systems Using Neural Networks: Controllability and Stabilization", IEEE Transactions On Neural Networks, vol. 4, No. 2, pp. 192–206, Mar. 1993.

Narendra, K.S. and Parthasarathy, K., "Identification and Control of Dynamical Systems Using Neural Networks", IEEE Transactions on Neural Networks, vol. 1, No. 1, pp. 4–27, Mar. 1990.

Search Report.

*Primary Examiner*—Tariq R. Hafiz

[57] ABSTRACT

A signal generator implements a dynamic behaviour described by differential equations specifying a predetermined functional relationship. The generator includes a mapping section for mapping inputs onto outputs according to a mathematical correspondence, differentiators at selective ones of the inputs for providing time-derivatives, and a feedback path for selectively coupling outputs to inputs, either directly or via the differentiators. The feedback path and differentiating means constrain the mapping and establish aforesaid relationship.

5 Claims, 2 Drawing Sheets

SIGNAL GENERATOR FOR MODELLING DYNAMICAL SYSTEM BEHAVIOR

This is a continuation of application Ser. No. 08/499,345, filed Jul. 7, 1995, now abandoned.

FIELD OF THE INVENTION

The invention relates to a signal generator for controllably implementing a dynamic signal behaviour. The generator comprises a receiving section for receiving a plurality of input signals. The receiving section includes differentiating means for creating a derivative of at least a selective one of the input signals with respect to an independent variable. The generator further comprises a mapping section with mapping inputs coupled to the receiving section for receiving the derivative and selective ones of the input signals, and with one or more mapping outputs for supplying a further plurality of output signals. The mapping section is operative to associate the received derivative and selective ones of the input signals with the output signals. The invention also relates to a method of enabling creating a dynamic signal behaviour.

BACKGROUND ART

A signal generator for controllably implementing a dynamic signal behaviour is typically used to control a dynamical system, e.g., a navigational aid in an automatic destination approach system of an aircraft, or to emulate a dynamical system, e.g., a semiconductor device, or as a model to simulate, e.g., a biological organism. The signal generation is based on a model of the dynamical system to be controlled, emulated or simulated.

Dynamical systems can be modelled in a variety of ways. For example, one could sample the quantities descriptive of the development of the process or the device to be modelled and cast the results into the format of a look-up table. A look-up table necessarily is of a discrete nature. Hence, if a high-resolution representation is desired, the model designer has to consider a vast amount of data.

Also, one could create a mathematical model such as a set of differential equations and thereupon map the model onto suitable hardware or software. Behaviour of realistic and dynamic processes or devices typically includes specific dependencies and interdependencies that, due to their complexity, cause massive trouble to the designer when they have to be modelled in hardware: e.g., non-linearities, multiple dimensions, implicit dependence on dependent variables, or when they have to modelled in software: e.g., numerical stability, required processing power and processing time in operational use. Each such dynamic process or device to be modelled has its own peculiarities that hamper a generic approach to the modelling problem, thus rendering conventional modelling rather expensive and time-consuming.

Alternatively, one could train a neural network with the help of training examples obtained from monitoring the actual dynamical system so that after training the neural network behaves to some extent in a similar manner as the dynamical system. Often, however, the architecture of the network suitable for the job is unknown in advance. Also, it is not straightforward how to implement dynamical behaviour by way of a neural net.

In "Approximation of Dynamical Systems by Continuous Time recurrent Neural Networks" by K.-I. Funahashi et al., Neural Networks Vol. 6, pp. 801–809, 1993, the authors consider a neural network as a model for a dynamical system. The dynamical system is of the type $dx/dt=F(x)$, wherein x is a vector defining the N-dimensional state of the system, "t" is the independent variable, for example "time", and wherein F is a vector function defining the rate of change of the vector x. According to Funahashi et al. the behaviour of a continuous time recurrent neural network with N output units can be made to approximate any finite time trajectory of the given N-dimensional dynamical system. The phrase "time recurrent neural network" is another expression for a network with an arbitrary interconnection pattern among the neurons. The proof of the statement relies on a theorem stating that an arbitrary continuous mapping from $R^n$ into $R^m$ can be approximated to an arbitrarily high accuracy by a linear combination of a sufficiently large number of (non-linear) neuron transfer functions.

Funahashi et al. merely demonstrate the existence of an equivalent neural net for a particular type of dynamical system, namely one that can be described by an autonomous differential equation. Funahashi et al. do not disclose how such a neural net model is to be created for an actual system to be modelled. The restriction to behaviour of the type $dx/dt=F(x)$ excludes from consideration those systems that receive input from external sources, or systems with explicit time dependencies. The neural net of Funahashi et al. is an approximation of the system's dynamical behaviour essentially in a finite time interval only.

U.S. Pat. No. 5,200,898, enclosed herein by way of reference, discloses a motor management system for use in a motor vehicle and that reads on the generator as specified in the preamble. The prior art system includes an adaptive neural net. The net is supplied with input signals that represent sensed quantities such as engine speed, temperature, and throttle valve opening in order to provide output signals for control of the automatic transmission and the fuel injection system. In FIG. 2 of this prior art reference, the neural net is shown to receive input signals $\theta$, $d/dt[\theta]$ and $d^2/dt^2[\theta]$ that stand for the throttle valve opening and its first and second time-derivatives. The net is used for predicting the throttle valve opening based on the sensed opening and its rate of change in order to reduce transmission shocks. The predicted throttle valve opening is supplied to a CPU to be compared with the actual opening valid at the moment that the prediction is supposed to hold true. If the discrepancy between predicted and actual value is larger than a predetermined threshold, the neural net is enabled to adapt itself to give better prediction. The prediction is eventually used to carry out the motor management task.

OBJECT OF THE INVENTION

It is an object of the invention to provide a signal generator for implementing a large variety of types of dynamic system behaviour, including behaviour affected by external sources, using a uniform architecture. It is a further object to use commercially available hardware as a generic building block to implement general types of dynamic behaviour.

SUMMARY OF THE INVENTION

To this end, the invention provides a signal generator as specified in the preamble and characterized in that the generator includes a feedback path between the mapping outputs and the receiving section for supplying at least a selective one of the output signals to the mapping section via the receiving section.

The invention is based on the following insight. The mapping of the mapping inputs onto the mapping outputs is accomplished according to, e.g., a mathematical correspondence, and basically is associating specific values of the mapping outputs to given values of the mapping inputs in accordance with specified rules. The mapping is defined on a domain that in principle is the function space spanned by the mapping inputs. Constraining the mapping inputs by way of feedback, forces the mapping inputs and the mapping outputs to remain in a sub-space, i.e., a hypersurface contained in the aforesaid space. As some of the mapping inputs are derivatives of other mapping inputs, e.g., time derivatives, the subspace implicitly defines a functional relationship in the form of one or more differential equations. Essentially, the differential equation is determined by the character of the mathematical mapping function, the operands of the differentiating means, and the interconnectivity pattern of the feedback paths. A suitable choice of the mapping operator, the differentiating operands and the feedback paths provides a signal generator that implements the dynamic behaviour of a dynamical system specified by the differential equations.

Note that the system disclosed in U.S. Pat. No. 5,200,898 does not include a feedback path to re-supply an output signal or its time derivative to an input of the mapping section, but furnishes the output signal to a CPU in order to compare it with an actual input signal for determining whether or not the system's neural net needs to be updated.

The receiving section may be operative to receive one or more specific ones of the input signals from a signal source external to the generator, thus taking account of external sources driving the dynamical system modelled.

The mapping section comprises, for example, a look-up table. The only requirement imposed on the mapping section is that the table maps input values onto output values according to a specific function, thus greatly simplifying the design. Alternatively, the mapping section includes a neural network, trained to perform the mapping. As known, three-layered perceptions can be designed to implement any kind of non-pathologic mapping from inputs to outputs. Also, neural nets may provide a continuous mapping, whereas a look-up table necessarily is restricted to a map of a discrete set onto (another) discrete set. In another embodiment, the mapping section comprises a logic gate array implementing the mapping in a Boolean representation. Gate arrays are well known electronic building blocks whose gate densities are enormous nowadays and whose operation is much faster than that of memories. Such gate arrays could be of the programmable or re-programmable type. In still another embodiment, the mapping section includes a processor based on fuzzy logic. In the fuzzy logic approach, a model is represented in qualitative terms only, and the mapping can be fully specified with help of a small number of parameters.

Preferably, the generator is programmable with respect to at least one of the following features: a selection of specific ones of the input signals to be operated upon by the differentiating means; the mapping of the mapping inputs onto the mapping outputs; a selection of specific ones of the output signals to be coupled to the receiving section via the feedback path; or the nodes to be interconnected through the feedback paths themselves. Such a programmable signal generator is a generic building block suitable for being customized for a wide variety of applications.

Preferably, the generator is implemented in digital electronic or optical circuitry. Advantages of digital embodiments relate to the fact that general-purpose ICs are readily available to implement the required functionalities in electronic versions, to the support of a modular architecture, to high computational speed and to a robust accuracy that can hardly be achieved by analog circuitry. Note that for analog circuitry noise immunity is low, arbitrary high precision is not possible and that there is no reliable analog non-volatile memory technology available. For digital neural nets, see, e.g., U.S. Pat. Nos. 4,994,982 (PHF 87,610) and 5,293,459 (PHF 88,638) incorporated herein by way of reference.

Also, the required functionalities can be fully implemented in software. Therefore, the invention also provides a method of enabling creating a dynamic signal behaviour. The method comprises: providing a plurality of input signals; supplying at least a selective one of the input signals to digital circuitry for providing a derivative of the selective input signal with respect to an independent variable; and supplying the derivative and selective ones of the input signals to further digital circuitry for creating one or more output signals according to a mathematical correspondence. The method is characterized by using at least a selective one of the output signals or a derivative of the selective output signal as input signal for supply to at least the digital circuitry or the further digital circuitry.

BRIEF DESCRIPTION OF THE DRAWING

The invention is explained below in further detail by way of example and with reference to the accompanying drawing, wherein.

Vector quantities are indicated in the text by bold type characters. Throughout the drawing, similar or corresponding parts are indicated by identical reference numerals.

DETAILED EMBODIMENTS

Figure 1:
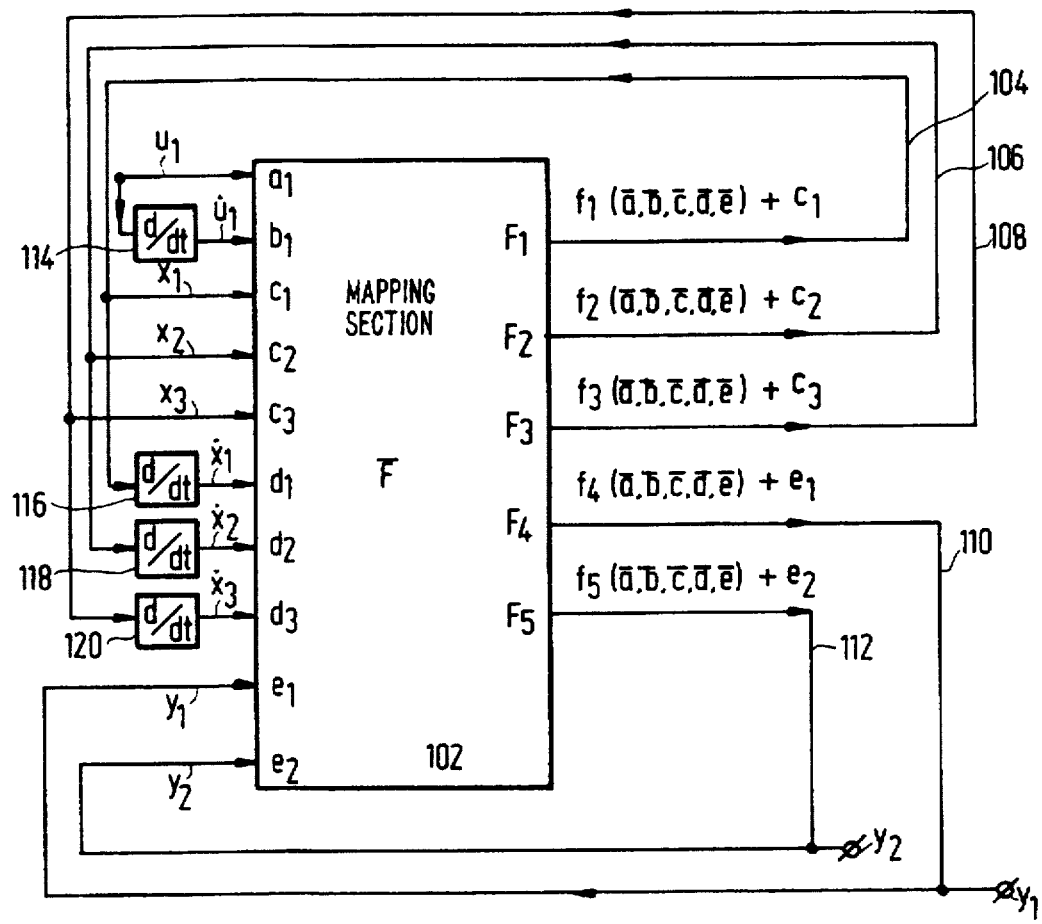
FIG. 1 gives a first block diagram of a generator of the invention.

FIG. 1 is a block diagram of a generator 100 in the invention. Generator 100 comprises a mapping section 102 for mapping of inputs $a_1$, $b_1$, $c_1$, $c_2$, $c_3$, $d_1$, $d_2$, $d_3$, $e_1$ and $e_2$ onto outputs $F_1$, $F_2$, $F_3$, $F_4$ and $F_5$ according to a mapping function F. Generator 100 also includes feedback paths 104, 106, 108, 110 and 112 from specific ones of the outputs to specific ones of the inputs of mapping section 102. Generator 100 further includes differentiating means 114, 116, 118 and 120. It is explained below how generator 100 is created and how it serves to model a dynamical system.

A general type of dynamical system is represented by a set of differential equations, e.g., in an implicit form (i) $f(u, u', x, x', y) = 0$ wherein:

u is the system input vector depending on a parameter "t" and has dimension $n_u$;

u' is the system input vector u differentiated with respect to an independent variable "t" and has dimension $n_u$; "t" is interpreted as "time" within the context of dynamical systems; however, "t" could be considered any independent variable, such as "position", occurring in the differential equations (i);

x is the system state vector indicative of the actual state of the system and has dimension $n_x$;

x' is the system state vector differentiated with respect to independent variable "t" and has dimension $n_x$;

y is the system output vector and has dimension $n_y$;

f is a multivariate vector function of dimension $n_f$, f=0 defining an implicit relationship between the aforesaid system vectors.

Now, suppose that mapping section 102 maps mutually independent input vectors a, b, c, d and e onto an output vector F according to:

(ii) F=F(a, b, c, d, e).

Vectors a, b, c, d and e have dimensionality $n_u$, $n_{u'}$, $n_x$, $n_{x'}$ and $n_y$, respectively. In the example illustrated by FIG. 1, $n_u=1$, $n_x=3$, $n_y=2$ and $n_f=5$. Mapping section 102 is, for instance, a look-up table or a neural net. As known, neural nets, specifically multi-layered feed-forward neural nets, can be trained to perform an arbitrary mapping. In addition, suppose that function F is:

(iii) F=(f(a, b, c, d, e), 0)$^T$+(c, e)$^T$, wherein f is the multivariate function introduced above in (i). The subsidiary vector 0 in the expression for F is introduced in case one has to take into account the proper number of components so that the addition in (iii) makes sense. That is, if $n_x+n_y$ is larger than $n_f$, then a subsidiary vector 0 with $n_f-(n_x+n_y)$ components is to be used. If $n_x+n_y$ is smaller than $n_f$, the subsidiary vector 0 is omitted and a number of $n_f-(n_x+n_y)$ dummy variables are added to vector e instead, in effect increasing the dimensionality of vector e. Note that the dummy variables do not appear in the functional relationship for f.

So far, the vector arguments in function F as defined in (iii) are not specified. Mapping section 102 thus provides a general type of mapping operating on input vectors a, b, c, d and e. These input vectors are not constrained to a particular part of the vector space and are not interdependent. Now, suppose that particular components of vector F defined in equation (iii) which are provided at the output of mapping section 102 are fed back to particular inputs of mapping section 102. More specifically, suppose that the following feedback paths are created. Component $F_1$ of vector F is fed back to the input for component $c_1$ of vector c via path 104. Component $F_2$ of vector F is fed back to the input for component $c_2$ of vector c via path 106. Component $F_3$ of vector F is fed back to the input for component $c_3$ of vector c via path 108. Component $F_4$ of vector F is fed back to the input for component $e_1$ of vector e via path 110. Component $F_5$ of vector F is fed back to the input for component $e_2$ of vector e via path 112. Then, as a result, the following constraints are made: $F_1=c_1$, $F_2=c_2$, $F_3=c_3$, $F_4=e_1$ and $F_5=e_2$. Owing to the special choice of F according to (iii), the constraints force the inputs of mapping section 102 to comply with: f(a, b, c, d, e)=0. Now, consider the presence of differentiators 114-120 at inputs $b_1$, $d_1$, $d_2$ and $d_3$. Due to the arrangement 114, 116, 118 and 120, the following relation holds true:

(iv) f(a, a', c, c', e)=0, wherein a' is the derivative of a with respect to "t" and c' is the derivative of c with respect to "t". Interpreting the vector a as the system input vector u, the vector c as system state vector x and vector e as system output vector y completes the modelling.

Mapping section 102 may comprise a simple look-up table as only a functional relationship is to be implemented. Alternatively, mapping section 102 may comprise a neural net, trained to implement the mapping. An adaptive neural net, i.e., a net that performs updates, could be used if the generator in the invention is to adapt to a changing environment. For example, the system to be simulated, emulated or controlled is an internal combustion engine that shows dynamic behaviour on two different time scales. The fastest time scale is reflected by the rate of change of the response of the dynamic system when the stimulus changes: e.g., the response of the engine to a change of the throttle. Slower time scales may be represented by changing stimulus-response characteristics: e.g., a changing throttle response due to an increase of the oil temperature, or to a change in barometric pressure, or owing to wear. After a time period has elapsed that is characteristic of a slow time scale, mapping section 102 of generator 100 has to be modified in order to provide the appropriate mapping. This could be taken care of by appropriate introduction of a parameter vector p into the expressions for function f:

(v) f(u, u', x, x', y, p, p')=0, wherein p is a slowly changing vector function of the independent variable "t", and wherein p' is its derivative with respect to "t".

Figure 2:
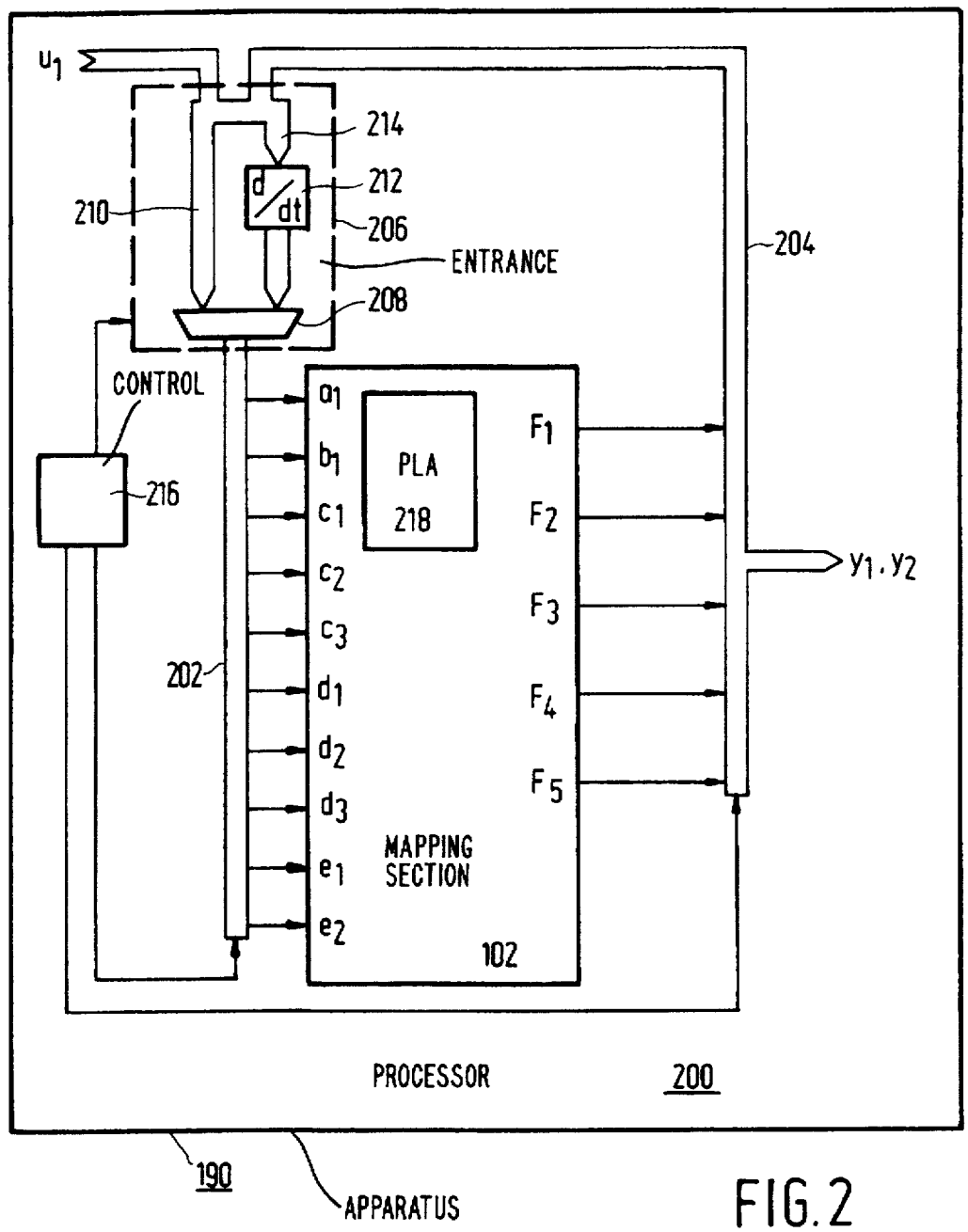
FIG. 2 gives a second block diagram of a generator of the invention.

FIG. 2 is a block diagram of a processor 200 according to the invention. Processor 200 is, for example, integrated as a controller in an apparatus 190 for executing or assisting in operational control of the apparatus 190. Processor 200 comprises mapping section 102, discussed above, whose inputs $a_1-e_2$ are coupled to an input bus 202 and whose outputs $F_1-F_5$ are coupled to an output bus 204. Output bus 204 provides outputs $F_1-F_3$ that serve as the components of system state vector x, and $F_4$ and $F_5$ that serve as the components of system output vector y. Bus 204 further routes outputs $F_1-F_5$ to an entrance 206. Entrance 206 also receives system input vector u, that in this example has only a single component $u_1$ for the sake of simplicity. Outputs $F_1-F_5$ and input $u_1$ are supplied to a routing device 208 directly via path 210 and indirectly through a differentiating device 212 via path 214. Differentiating device 212 calculates the derivatives of outputs $F_1-F_3$ and input $u_1$ with respect to a parameter "t". Routing device 208 selectively routes the quantities provided by paths 210 and 214 to input bus 202. The distribution of signals among buses 202 and 204, and the operation of routing device 208 is controlled by a controller 216.

Mapping section 102 includes a programmable device 218 that determines the mapping of inputs $a_1-e_2$ onto outputs $F_1-F_5$. Device 218 includes, for example, a programmable memory for use as a look-up table, or a programmable logic gate array, or a neural net. Device 218 may be programmable by the manufacturer so that the modular structure of processor 200 can be used uniformly in a large variety of applications. Device 218 could also be user-programmable to customize the operation of processor 200. In case of device 218 containing a neural net, the net's synaptic coefficients or other operational parameters could be programmable or modifiable, or the interconnection pattern among the neurons could be programmable or modifiable.

Similarly, controller 216 could be programmable so that processor 200 is suitable for all kinds of signal routing over buses 202 and 204 to inputs $a_1-e_2$ and from outputs $F_1-F_5$, and through entrance 206 directly or indirectly via differentiating device 212.

Note that one or more of differentiators 114-120 could be replaced by integrators for integrating the respective input over the independent variable "t", to allow for more intricate relationships.

I claim:

1. A device comprising an electronic circuit with a signal generator for providing a generator signal at a generator output, the signal generator comprising:

a mapping section having:

first, second and third mapping inputs for receiving first, second and third mapping input signals, respectively; and first and second mapping outputs for supplying first and second mapping output signals, respectively, each respective one of the first and second mapping output signals being determined by a respective functional relationship between the first, second and third mapping input signals;

a first feedback path connected between the first mapping output and the first mapping input for supplying the first mapping output signal to the first mapping input;

a second feedback path interconnecting the first mapping output and the second mapping input, the second feedback path comprising differentiating means for providing to the second mapping input a derivative of the first mapping output signal with respect to an independent variable; and a third feedback path interconnecting the second mapping output to the third mapping input, the generator output being connected to the third feedback path; wherein:

the first and third feedback paths are operative to constrain the first, second and third mapping input signals to an interdependence determined by the functional relationships; and the second feedback path is operative to create a differential equation from the interdependence.

2. The device of claim 1, wherein the mapping section has a fourth mapping input for receiving a fourth input signal generated externally from the signal generator.

3. The device of claim 1, wherein the mapping section comprises at least one of the following:

a look-up table;

a logic gate array;

a neural network;

a fuzzy processor.

4. The device of claim 1, wherein the mapping of the first, second and third mapping inputs onto the first and second mapping outputs is programmable.

5. A method of generating a specific signal, the method comprising:

receiving first, second and third mapping input signals at first, second and third mapping inputs, respectively;

supplying first and second mapping output signals at first and second mapping outputs, respectively, each respective one of the first and second mapping output signals being determined by a respective functional relationship between the first, second and third mapping input signals;

feeding back the first mapping output signal to the first mapping input and the second mapping output signal to the third mapping input to constrain the first, second and third mapping input signals to an interdependence determined by the functional relationships;

providing to the second mapping input a derivative of the first mapping output signal with respect to an independent variable to create a differential equation from the interdependence; and tapping the third mapping input for generating the specific signal.

* * * * *